United States Patent
Chen et al.

(10) Patent No.: US 9,146,824 B1
(45) Date of Patent: Sep. 29, 2015

(54) MANAGEMENT OF BIT LINE ERRORS BASED ON A STORED SET OF DATA

(71) Applicant: Marvell International Ltd., Hamilton (BM)

(72) Inventors: Chih-Ching Chen, Milpitas, CA (US); Hyunsuk Shin, San Jose, CA (US); Chi Kong Lee, Fremont, CA (US); Siu-Hung Frederick Au, Fremont, CA (US); Jungil Park, San Jose, CA (US); Fei Sun, Santa Clara, CA (US)

(73) Assignee: Marvell International Ltd., Hamilton (BM)

(*) Notice: Subject to any disclaimer, the term of this patent is extended or adjusted under 35 U.S.C. 154(b) by 242 days.

(21) Appl. No.: 13/669,359

(22) Filed: Nov. 5, 2012

Related U.S. Application Data (60) Provisional application No. 61/555,604, filed on Nov. 4, 2011.

(51) Int. Cl.
*G06F 11/22* (2006.01)
*G11C 29/00* (2006.01)

(52) U.S. Cl.
CPC ............ *G06F 11/2268* (2013.01); *G11C 29/88* (2013.01)

(58) Field of Classification Search
CPC ..... G06F 11/22; G06F 11/2268; G11C 29/08; G11C 29/12; G11C 29/70; G11C 29/88
USPC ......................................... 714/6.1, 6.11, 6.13
See application file for complete search history.

(56) References Cited

U.S. PATENT DOCUMENTS

| | | | | |
|---|---|---|---|---|
| 5,631,868 | A * | 5/1997 | Termullo et al. | 365/200 |
| 6,260,156 | B1 * | 7/2001 | Garvin et al. | 714/6.13 |
| 6,463,550 | B1 * | 10/2002 | Cepulis et al. | 714/25 |
| 6,490,697 | B1 * | 12/2002 | Machida et al. | 714/42 |
| 6,505,313 | B1 * | 1/2003 | Phan et al. | 714/718 |
| 7,064,980 | B2 | 6/2006 | Cernea | |
| 7,443,757 | B2 | 10/2008 | Cernea | |
| 7,492,640 | B2 | 2/2009 | Mokhlesi | |
| 7,532,514 | B2 | 5/2009 | Cernea | |
| 8,589,730 | B2 * | 11/2013 | Byom et al. | 714/16 |
| 2002/0073367 | A1 * | 6/2002 | Hartmann | 714/719 |

OTHER PUBLICATIONS

Wikipedia's Flash Memory version from Oct. 29, 2011 http://en.wikipedia.org/w/index.php?title=Flash_memory&oldid=457977012.*

* cited by examiner

*Primary Examiner* — Joseph Schell (57) ABSTRACT

The present disclosure includes systems and techniques relating to management of bit line errors based on a stored set of data. In some implementations, a system can include a device including non-volatile solid state memory and a memory controller. The memory controller can be configured to identify, from the solid state memory of the device, one or more bit line errors for the device upon power up of the system, construct a set of data corresponding to the one or more bit line errors for the device, store the set of data, at least in part, in the device, and, upon a subsequent power up of the system, identify the one or more bit line errors for the device from the stored set of data.

30 Claims, 6 Drawing Sheets

MANAGEMENT OF BIT LINE ERRORS BASED ON A STORED SET OF DATA

CROSS-REFERENCE TO RELATED APPLICATIONS

This application claims priority to U.S. Provisional Application Ser. No. 61/555,604 filed on Nov. 4, 2011, the disclosure of which is incorporated herein by reference in its entirety.

TECHNICAL FIELD

The subject matter of this application is generally related to identification of bit line errors in non-volatile memory.

BACKGROUND

Memories typically employ arrays of analog memory cells for storing data. Each analog memory cell can store an analog value, such as an electrical charge or voltage, that represents the data stored in a corresponding cell. Each analog memory cell can hold a certain amount of electrical charge. A range of possible analog values is typically divided into intervals each corresponding to one or more data bit values (e.g., two bits, three bits or four bits). Generally, data is written to an analog memory cell by writing a nominal analog value that corresponds to a desired bit or bits.

Commonly, two types of memory devices are used: single-level cell (SLC) flash memory and multi-level cell (MLC) flash memory. SLC flash memory can store a single bit of information in each memory cell, whereas MLC flash memory can store two or more bits per memory cell. While programming for SLC flash memory is generally simple (e.g., as only one bit is placed in a cell), its storage capacity is generally smaller than MLC flash memory and thus less desirable for applications that demand large storage capacity.

During fabrication of memory cells, errors or defects in a small portion of the cells are expected. Manufacturers of memory devices can employ validation processes that detect bit line errors. Based on the validation process, a signature or information identifying usable bits of a memory device can be placed into respective bits to support identification of usable bit lines. Upon integration of the memory device, a system or controller can scan the memory device for the signatures or information identifying usable bit lines and employ a mechanism to re-route or bypass defective bit lines.

SUMMARY

The present disclosure includes systems and techniques relating to identifying bit line errors in non-volatile memory. According to an aspect of the described systems and techniques, a system can include a device including non-volatile solid state memory and a memory controller. The memory controller can be configured to identify, from the solid state memory of the device, one or more bit line errors for the device upon power up of the system, construct a set of data corresponding to the one or more bit line errors for the device, store the set of data, at least in part, in the device, and, upon a subsequent power up of the system, identify the one or more bit line errors for the device from the stored set of data.

In some implementations, the device can be a device of multiple devices. In some implementations, the set of data can be stored in multiple memory pages. In some implementations, the multiple memory pages can be within one device and, upon a subsequent power up, the one or more bit line errors for the devices can be identified, at least in part, by accessing the multiple memory pages in series. In some implementations, at least two of the multiple memory pages can be within different devices and, upon a subsequent power up, the one or more bit line errors for the devices can be identified, at least in part, by accessing the multiple memory pages in parallel. In some implementations, the devices are NAND devices.

According to another aspect of the described systems and techniques, a memory controller can include an interface to connect with non-volatile solid state memory of multiple devices and circuitry to identify, from the non-volatile solid state memory of the devices, one or more bit line errors for the devices upon power up of the system, construct a set of data corresponding to the bit line errors for the devices, store the set of data, at least in part, in a device, and, upon a subsequent power up of the system, identify the one or more bit line errors from the stored set of data.

According to another aspect of the described systems and techniques, a method can include identifying, from the non-volatile solid state memory of multiple devices, one or more bit line errors for the devices upon power up of the system, constructing a set of data corresponding to the one or more bit line errors for the devices, storing the set of data, at least in part, in a device, and, upon a subsequent power up of the system, identifying the one or more bit line errors from the stored set of data.

In some implementations, two or more copies of the set of data can be stored in one or more devices. In some implementations, identifying the one or more bit line errors upon the subsequent power up can include comparing the two or more copies of the set of data and identifying the one or more bit line errors based on the comparison of the two or more copies of the set of data.

In some implementations, the set of data can be stored in multiple memory pages. In some implementations, the multiple memory pages can be within one device and, upon a subsequent power up, the one or more bit line errors for the devices can be identified, at least in part, by accessing the multiple memory pages in series. In some implementations, at least two of the multiple memory pages can be within different devices and, upon a subsequent power up, the one or more bit line errors for the devices can be identified, at least in part, by accessing the multiple memory pages in parallel.

In some implementations, identifying the one or more bit line errors upon the subsequent power up can include identifying, from non-volatile solid state memory of the device, any bit line error of the device, reading the set of data from the device, and identifying the one or more bit line errors for the multiple devices based on the set of data stored in the device.

Particular embodiments of the subject matter described in this specification can be implemented so as to realize one or more of the following advantages. This technology can significantly reduce the time required to identify defective bit lines of a memory device. At any subsequent power up of a system, bit line error information can be made available to the system without scanning the entire memory of all memory devices of the system.

Additionally, the described technology can reduce the overall cost of a storage system including memory devices, where the cost to manage defective bit lines is adopted by the memory controller (i.e., the memory controller manages defective bit lines) and not the memory devices of the storage system.

The details of one or more embodiments of the invention are set forth in the accompanying drawings and the descrip-

DESCRIPTION OF DRAWINGS

Like reference symbols in the various drawings indicate like elements.

DETAILED DESCRIPTION

The systems and techniques described herein can be implemented as one or more devices, such as one or more integrated circuit (IC) devices, in an electronic data storage device.

Memories are commonly structured as rectangular arrays of memory cells. The memory cells are arranged in orthogonal bit lines and word lines. One or more bits of data are written to each memory cell by injecting sufficient electrical charge into a floating gate of the memory cell to place the memory cell's threshold voltage within a range of threshold voltages that represents the value of that bit or of those bits. A memory cell is then subsequently read by comparing its threshold voltage to reference voltages that mark the boundaries between threshold voltage ranges. For a NOR flash memory, the memory cells are written and read individually. For a NAND flash memory, the memory cells are written and read one page at a time, with each word line including a small integral number (typically one or two, generally no more than four) of pages. The word lines are grouped further into blocks, such that memory cells are erased an entire block at a time.

Defects within bit lines of a memory device can arise, for example, during a fabrication process of the memory device. The defects can be detected during a validation process and signatures indicating usable bit lines can be placed in respective bits of the bit line. The signatures of each bit line in a memory device can be read individually and bit line errors can be identified based on the signature (e.g., a bit is presumed defective if it does not include the expected signature). Upon identification of bit line errors defective bit lines can be bypassed to ensure that data is only stored in usable bit lines of the memory device. This identification of bit line errors is generally performed at every power up of a system, e.g., a solid state drive system, which includes memory devices.

The information identifying the defective bit lines is generally stored in a memory unit of the system and available to a memory controller. A memory controller can be a central processor unit (CPU), a solid state drive controller, a solid state memory controller, or any other device configured to manage memories. At power down of the system, the contents of the memory unit, including bit line error information, can be erased. At any subsequent power up, the memory devices of the system are tested again to identify the bit line errors for the memory devices. Scanning of the memory devices for bit line errors can be very time consuming and may deplete system resources, particularly when the system includes a large quantity of memory devices.

In some implementations, bit line error information can be stored in a set of data (e.g., in a table). The set of data can be stored directly in one or more of the memory devices upon completing the validation process. By storing the bit line error information in a persistent memory of one or more of the memory devices, the bit line error information can be retrieved at any subsequent power up of the system. This can provide a mechanism for the system to retrieve the bit line error information for all memory devices without scanning each individual bit line of the memory devices to detect bit line errors. Since the bit line error information can be available without the time consuming scan process of the memory devices, a time from power up to functional use of the memory devices can be significantly reduced.

Figure 1A:
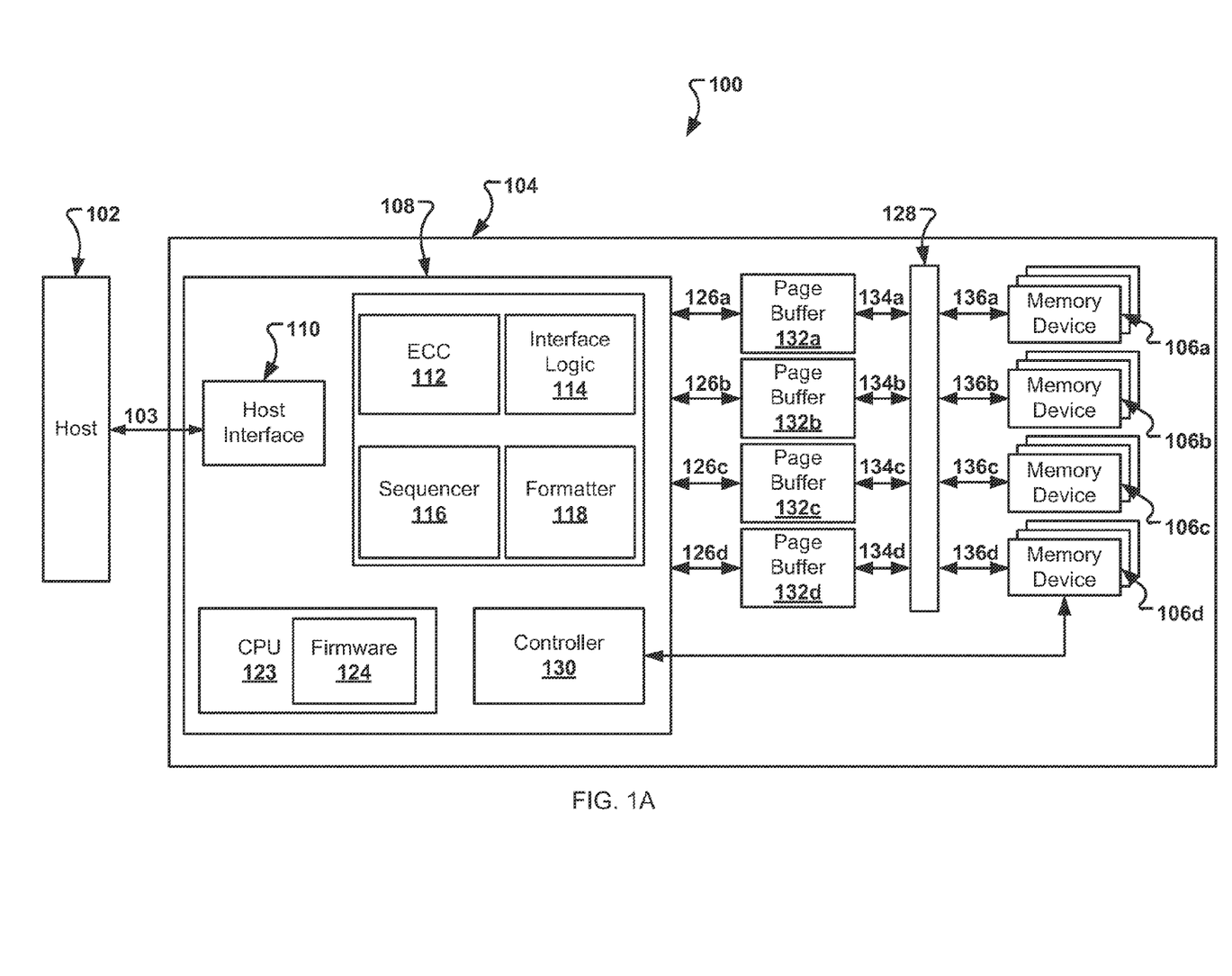
FIG. 1A shows an example of a solid state drive system.

FIG. 1 shows an example of a solid state drive system 100. As shown in FIG. 1, the system 100 can include a host 102 and a solid state drive system 104. The solid state drive system 104 can include a host interface 110, a central processor unit (CPU) 123, a memory interface 128, a controller 130 and memory devices 106a, 106b, 106c and 106d (e.g., flash memory devices, NOR Flash EEPROM (Electrically Erasable Programmable Read-Only Memory), AND Flash EEPROM, DiNOR Flash EEPROM, Serial Flash EEPROM, DRAM (Dynamic Random Access Memory), SRAM (Static Random Access Memory), EPROM (Erasable Programmable Read-Only Memory), FRAM (Ferroelectric Random Access Memory), MRAM (Magnetoresistive Random Access Memory), or PCRAM (Phase-Change Random Access Memory)).

The host 102 can communicate with the solid state drive system 104 through the host interface 110. The host interface 110, in some implementations, can include a Serial Advanced Technology Attachment (SATA) interface or a Parallel Advanced Technology Attachment (PATA) interface. A SATA interface or PATA interface can be used to convert serial or parallel data into parallel or serial data, respectively. For example, if the host interface 110 includes a SATA interface, then the SATA interface can receive serial data transferred from the host 102 through a bus 103 (e.g., a SATA bus), and convert the received serial data into parallel data. In other implementations, the host interface 110 can include a hybrid interface. In these implementations, the hybrid interface can be used in conjunction with, for example, a serial interface.

The host interface 110, in some implementations, can include one or more registers in which operating commands and addresses from the host 102 can be temporarily stored. The host interface 110 can communicate a PROGRAM or READ command to a solid state controller 108 in response to stored information in the register(s).

As shown in FIG. 1A, the solid state controller 108 can include the host interface 110, an error correction code (ECC) module 112, interface logic 114, a sequencer 116, a formatter 118, a CPU 123 containing embedded firmware 124 by which the solid state controller 108 can be controlled, and a controller 130. The CPU 123 can include a microprocessor, a signal processor (e.g., a digital signal processor) or microcontroller.

In some implementations, the CPU 123 with the embedded firmware 124 can reside outside of the solid state drive system 104.

In some implementations, the solid state drive system 104 can include one or more channels 126a, 126b, 126c and 126d, and each channel 126a-126d can be configured to receive one or more control signals (e.g., four chip-enable signals) or READ, PROGRAM or ERASE data or commands from the host 102 or from the memory devices 106a-106d.

The solid state controller 108 can be configured to handle any suitable command, status, or control request for access to the memory devices 106a-106d. For example, the solid state controller 108 can be configured to manage and control storage and retrieval of data in the memory devices 106a-106d. To initialize a READ, PROGRAM or ERASE operation, the solid state controller 108 can receive one or more service requests or commands (e.g., READ, PROGRAM and ERASE requests) from the host 102 (or from the controller 130).

In some implementations, the solid state controller 108 can be a part of a microcomputer system under the control of a microprocessor (not shown). The solid state controller 108 can control the flow of commands and data between the host 102 and the solid state drive system 104. In some implementations, the solid state controller 108 can include read-only memory (ROM), random-access memory (RAM) and other internal circuits. The solid state controller 108, in some implementations, can be configured to support various functions associated with the memory devices 106a-106d, such as, without limitation, diagnosing the memory devices 106a-106d, sending commands (e.g., activation, READ, PROGRAM, ERASE, pre-charge and refresh commands) to the memory devices 106a-106d, and receiving status from the memory devices 106a-106d. Diagnosing the memory devices can include the identification of defective bit lines within the memory devices. The solid state controller 108 can be formed on a same or different chip as the memory devices 106a-106d. The solid state controller 108 also can be formed on a same or different chip as the solid state drive system 104.

The memory devices 106a-106d can be coupled with the memory interface 128. In some implementations, if the memory devices 106a-106d include NAND-type memory devices, the memory interface 128 can be a NAND flash input/output interface.

In some implementations, the solid state drive system 104 (and/or the host 102) can be mounted on a system on-chip (SOC). The SOC, in these implementations, can be fabricated using, for example, a digital process. The SOC can include an embedded process system (e.g., an embedded CPU) separate from the CPU 123 in the solid state drive system 104. The SOC also can include a SRAM (Static Random Access Memory), system logic, cache memory and cache controller for processing program code and data. The program code and data associated with the embedded process system can be stored in the memory devices 106a-106d, and communicated to the SOC through, for example, an SOC interface (not shown). The SOC interface can be used by a translator for translating information flowing between the interface and the internal bus structure of the SOC. Control signals can flow from the SOC to the memory devices 106a-106d while instructions and data can flow from the memory devices 106a-106d to the SOC during READ operations. Instructions and data also can be sent to the memory devices 106a-106d during PROGRAM operations.

In some implementations, the memory devices 106a-106d can be controlled by the controller 130. The host 102 can communicate with the memory devices 106a-106d through the controller 130. The controller 130 can be connected to the memory devices 106a-106d through a corresponding pin or terminal. In these implementations, the controller 130 can be implemented as an application specific integrated circuit (ASIC) or as an SOC.

Additionally or alternatively, the host 102 can communicate with the memory devices 106a-106d through the solid state controller 108. For example, the host 102 can transmit one or more commands to the solid state controller 108, and through the memory interface 128, the solid state controller 108 can send the host's commands to the memory devices 106a-106d. The memory interface 128 can be a NAND flash I/O interface. The NAND flash interface can include one or more pins each corresponding to a specific function, as will be discussed in greater detail below.

In some implementations, the memory devices 106a-106d can be coupled with a plurality of page buffers 132a, 132b, 132c and 132d. In some implementations, each memory device 106a-106d can be associated with a respective page buffer 132a-132d. For example, as illustrated in FIG. 1A, the memory device 106a can be associated with the page buffer 132a; the memory device 106b can be associated with the page buffer 132b; the memory device 106c can be associated with the page buffer 132c; and the memory device 106d can be associated with the page buffer 132d. If desired, each memory device 106a-106d also can be associated with more than one page buffer.

In some implementations, the page buffers 132a-132d can be used as a temporary storage during PROGRAM/READ operations on the memory cells of the selected page. Each page buffer 132a-132d can have a storage capability at least equal to a storage capability of a memory page (e.g., 2 Kb).

Each page buffer 132a-132d can store one page of write data to be programmed into one page of memory cells. Each page buffer 132a-132d can include, without limitation, registers, sense circuits for sensing data read from one page of memory cells, verify logic, latching circuits or writing drivers. During PROGRAM operations, each page buffer 132a-132d can latch PROGRAM data received over a respective channel 126a-126d, and transfer the latched data to the respective memory device 106a-106d. Each page buffer 132a-132d also can perform program verify operations to ensure that the programmed data has been properly programmed into the memory devices 106a-106d.

As discussed above, the page buffers 132a-132d can be connected to the solid state controller 108 through respective channels 126a-126d. In some implementations, the page buffers 132a-132d also can be connected to the memory interface 128 through respective channels 134a, 134b, 134c and 134d, and to the memory devices 106a-106d through channels 136a, 136b, 136c and 136d. In some implementations, both the memory interface 128 and the page buffers 132a-132d can be formed as internal components of the solid state drive system 104 or the solid state controller 108. In other implementations, the page buffers 132a-132d can be formed as external components to the solid state drive system 104 or the solid state controller 108.

To select a particular page buffer 132a-132d for storing PROGRAM data, input (e.g., user input or input provided by software programs) can be received through a double data rate (DDR) interface (not shown), which can be error-corrected by the ECC module 112. For READ data, the ECC module 112 can be used to correct any error present in the READ data retrieved from the memory devices 106a-106d. For PROGRAM data, the ECC module 112 can be used to add one or more redundant bits to the PROGRAM data. Once the PROGRAM data is written, the redundant bits allow error-correction to be performed in a subsequent READ cycle of the written PROGRAM data. The ECC module 112 can first select a set of data to be rewritten to the memory devices 106a-106d, add redundant data to the selected set of data, and pass the selected set of data with the redundant information to the memory devices 106a-106d through a corresponding channel 126a-126d (e.g., following a firmware request order issued by the firmware 124). Output of the ECC module 112 then can be used as a SELECT signal to designate a page buffer 132a-132d for a particular PROGRAM operation.

In some implementations, the memory devices 106a-106d can be multi-plane memory devices each including, for example, four planes. Each memory device 106a-106d also can include a non-volatile memory (e.g., a single-level flash memory or a multi-level flash memory). In some implementations, the nonvolatile memory can include a NAND-type flash memory module. A NAND-type flash memory module can include a command/address/data multiplexed interface such that commands, data, and addresses can be provided through corresponding input/output pins. Advantages of using NAND-type flash memory devices as the memory devices 106a-106d include, without limitation, faster boot and resume times; longer battery life; and higher data reliability.

Each memory device 106a-106d can be connected to a respective channel 126a-126d. Each channel 126a-126d can support, for example, one or more input and output lines, chip select signal lines, chip enable signal lines and the like. The channel also can support other signal lines such as, without limitation, write enable, read enable, read/busy output, and reset signal lines. To increase the degree of parallelism, each memory device 106a-106d can have its own channel connected to the solid state drive system 104 as shown in FIG. 1A. For example, memory device 106a can be connected to the solid state drive system 104 using channel 126a; memory device 106b can be connected to the solid state drive system 104 using channel 126b; memory device 106c can be connected to the solid state drive system 104 using channel 126c; and memory device 106d can be connected to the solid state drive system 104 using channel 126d. In other implementations, the memory devices 106a-106d can share a common channel.

The memory devices 106a-106d can be connected to the solid state drive system 104 via standard interfaces such as an Open NAND Flash Interface (OFNI). For the host-to-drive connection, standard connectors can be used that include, without limitation, SATA, USB (Universal Serial Bus), SCSI (Small Computer System Interface), PCMCIA (Personal Computer Memory Card International Association), and IEEE-1394 (Firewire).

Each memory device 106a-106d can include one or more dies (e.g., flash dies), each being selected using a chip enable signal or chip select signal. A solid state storage die can be partitioned into planes, blocks and pages. In some implementations, a page can have a capacity of 2 Kbytes, 4 Kbytes, 8K bytes or 16 KB. In some implementations, each die can be configured as a single bit memory cell (SLC) or multi-level memory cell (MLC), with a corresponding command.

Where multiple dies are used, in some implementations, the solid state drive system 104 can access more than one die in a same memory device at the same time. The solid state drive system 104 also can access different dies in different memory devices at the same time. The capability to access more than one die allows the solid state drive system 104 to fully utilize the available resources and channels 126a-126d to increase the overall performance of the solid state drive system 104. Further, where the memory devices 106a-106d share a same memory input/output line and control signal (e.g., chip enable signal), the number of pins of the solid state controller 108 can be reduced to further minimize the cost for manufacturing the solid state drive system 104.

A memory array of a memory device 106a-106d can typically be organized into bits, bytes, or pages. For example, a page can include a user portion containing 2 k bytes (or 2 kB), and a spare portion containing 64 bytes. The memory array further can be organized into blocks. For example, each block can contain 128 pages.

Each of the memory devices 106a-106d can be a multi-plane NAND flash memory device. NAND flash memory devices generally have higher density and lower cost per bit than NOR-type flash memory devices. A NAND flash memory can be coupled with a NAND flash I/O interface that allows sequential access to data. A NAND flash I/O interface can include multiple pins each corresponding to a specific function.

A bit, either a zero-bit or a one-bit, can generally be stored in a memory cell of the memory device 106a-106d. A memory cell is a memory element containing values of one or more data bits. A single-level memory cell (SLC) stores only one bit of data whereas a multi-level memory cell (MLC) can store more than one bit by choosing between multiple levels of electrical charge to apply to the floating gate of the memory cell. For example, while a SLC can be programmed with a logical value of "1" or "0", a MLC can be programmed with a logical value of "11", "10", "01", or "00".

Figure 1B:
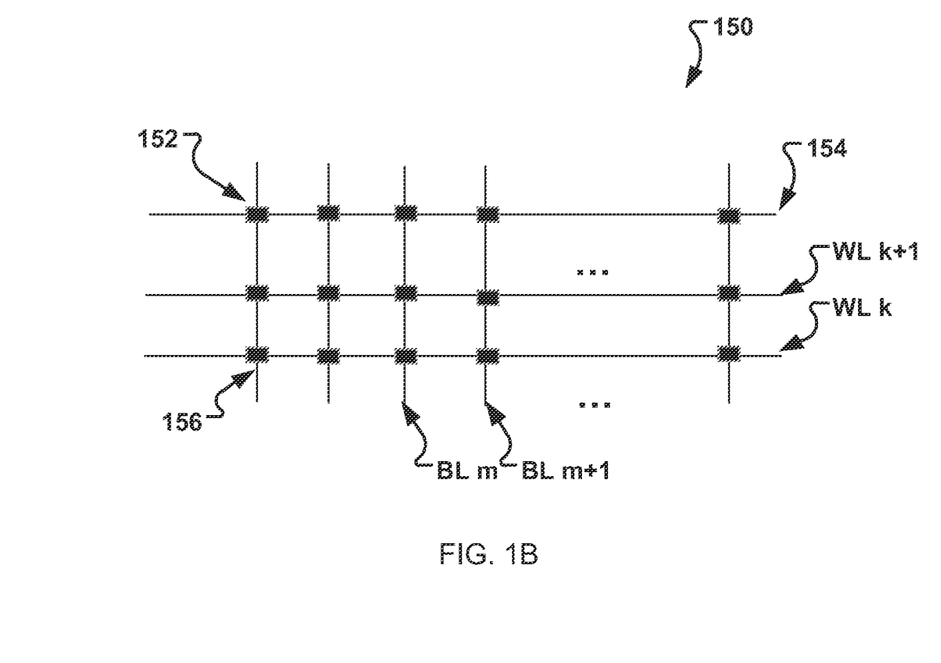
FIG. 1B shows an example of a flash memory array.

Referring to FIG. 1B, memory cells 152 of memory array 150 are arranged in a grid having multiple rows and columns. Though not illustrated, each memory cell 152 can include a floating gate transistor. A certain amount of electrical charge (electrons or holes) can be stored in a particular memory cell by applying appropriate voltage levels to the transistor gate, source and drain. The value stored in the memory cell can be read by measuring the threshold voltage of the memory cell. The threshold voltage is the minimal voltage that needs to be applied to the gate of the transistor in order to drive the transistor to a conduction state. The read threshold voltage can then be used to indicate the charge stored in the memory cell.

The gates of the transistors in each row can be connected by a respective word line 154 (e.g., WL k, WL k+1, . . . , where k≥0 and is an integer), and the sources of the transistors in each column can be connected by a bit line 156 (e.g., BL m, BL m+1, . . . , where m≥0 and is an integer). Where NOR memory cells are used, the sources can be connected to the bit lines 156 directly, and where NAND memory cells are used, the bit lines 156 can be connected to strings of floating-gate memory cells.

As discussed previously, a memory cell array can be divided into multiple pages, (e.g., groups of memory cells that are programmed and read simultaneously). Pages are sometimes sub-divided into sectors. In some implementations, each page can include an entire row (word line) of the array. In other implementations, each row can be divided into two or more pages. For example, each row can be divided into two pages with one including the odd-order memory cells and the other including the even-order memory cells. In some implementations, a two-bit-per-memory cell memory can include four pages per row; a three-bit-per-cell memory can include six pages per row; and a four-bit-per-memory cell memory can include eight pages per row.

Erasing of memory cells can be carried out in blocks that contain multiple pages. A memory can include several hundreds or thousands erasure blocks. In a typical two-bit-per-memory cell memory, each erasure block can be on the order of thirty-two word lines, each including several hundreds or thousands of memory cells. Each word line can be partitioned into four pages (e.g., odd/even order memory cells, and least/most significant bit of the memory cells). Similarly, a three-bit-per-memory cell memory can include thirty-two word lines per erasure block and one hundred ninety two pages per erasure block, while a four-bit-per-memory cell memory can include two hundred fifty six pages per erasure block.

Figure 2A:
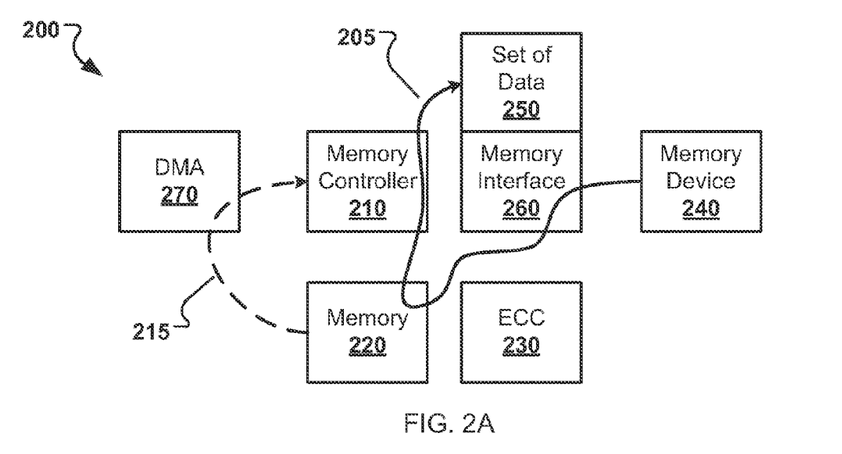
FIG. 2A shows an example of a sequence for scanning a memory device for bit line errors.

FIG. 2A shows an example of a sequence 200 for scanning a memory device for bit line errors. In some implementations, the process of scanning for bit line errors can follow path 205. A memory controller 210 can initiate a scanning of every bit line within a memory device 240 (e.g., by data output command) through a memory interface 260 at power up of the system (e.g., solid state drive system 100). The individual bits of the bit lines within the memory device 240 can include information, such as signatures, indicating whether a respective bit is defective or usable. The memory controller 210 can determine whether each individual bit of the bit lines includes a correct signature and store information identifying defective bit lines to memory 220 (e.g., system memory). The bit line error information can be retrieved by the memory controller 210 from memory 220 and a set of data 250 including or derived from the bit line error information can be created. By using the bit line error information stored in the set of data 250, the system can employ measures to re-route or skip defective bit lines.

In some implementations, the memory controller 210 can initiate scanning of the memory device 240 to retrieve the bit line error information through a Direct Memory Access (DMA) engine 270 as shown by path 215. DMA 270 allows access to the memory device 240 independently of the memory controller 210. The memory controller 210 initiates the scanning of the memory device to retrieve the bit line error information and the scan and transfer of the bit line errors is performed by the DMA controller while the memory controller 210 can perform other operations. The bit line error information can be stored in the memory 220. A set of data 250 including or derived from the bit line error information can be created from the information stored in the memory 220.

The memory 220 can be volatile memory and thus its data may be lost on power down of the system, including the constructed set of data 250. At any subsequent power up, it would not be known which bit lines are defective or usable without repeating the above described scanning process to identify defective bit lines and employ measures to re-route or skip the defective bit lines. This process can be time consuming since each bit within each memory device 240 of a system would have to be scanned at every power up to identify defective bit lines.

Figure 2B:
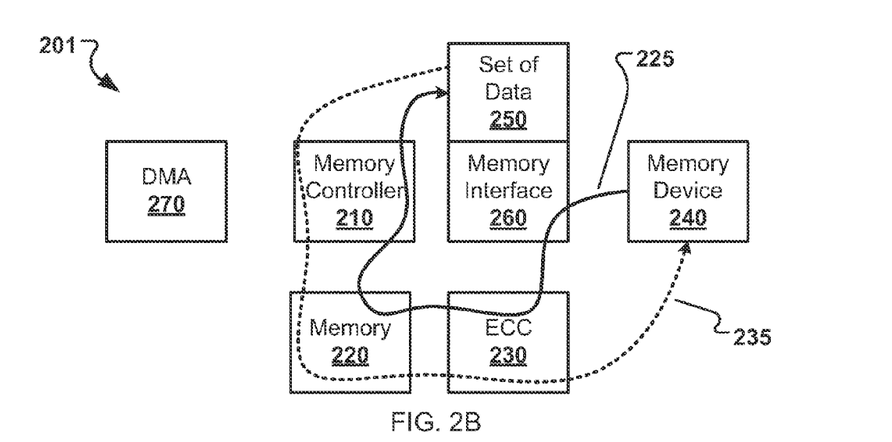
FIG. 2B shows an example of a sequence for scanning a memory device for bit line errors and storing a set of data in the memory device.

FIG. 2B shows an example of a sequence 201 for scanning a memory device for bit line errors and storing a set of data in the memory device. In some implementations, the process of scanning bit line errors can follow path 225. The memory controller 210 can initiate the scanning of every bit line within the memory device 240 (e.g., by data output command) through the memory interface 260 at power up of the system (e.g., solid state drive system 100) and store the bit line error information in the memory 220 as described above. In some implementations, the bit line error information can be passed through an Error Correction Code (ECC) module 230 before the bit line error information is stored in the memory 220. The ECC module 230 can be used to correct any error present in the bit line error information retrieved from the memory device 240. The memory controller 210 can read the bit line error information from the memory 220 and create a set of data 250 including or derived from the bit line error information.

In some implementations, the set of data 250 can be stored in the memory device 240 (e.g., in sections of the memory device designated for system data). The process of writing the set of data 250 into the memory device 240 can follow path 235. The memory controller 210 can initiate the writing process of the set of data 250 from the memory 220 to the persistent memory of the memory device 240. The set of data 250 can be routed through the ECC module 230 before it is stored in the memory device 240. The ECC module can be used to add one or more redundant bits to the information in the set of data 250. The redundant bits can allow error correction for subsequent read cycles of the set of data 250. The stored set of data 250, and thus desired bit line error information, can be available to the system at any subsequent power up without repeating the scanning process of each memory device in the system.

The set of data 250 can be relatively small compared to the overall size of the memory device 240. For example, if an 8 KB memory device is fabricated to a specification that allows for a maximum of 24 bit line errors, a system with 4 devices may generate a set of data including bit line error information with 96 data points (4 devices ×24 bit line errors). Thus, the quantity of data points defining defective bit lines the system would have to retrieve to identify all defective bit lines of the four devices is substantially smaller than scanning the four devices of 8 KB each at every subsequent power up.

In some implementations, multiple copies (e.g., 10 copies) of the set of data 250 can be stored at one or more memory devices 240 of the system. On any subsequent power up, the copies of the set of data 250 can be retrieved from the memory device(s) 240 and contents of the retrieved copies can be compared. The copies of the set of data 250 can be stored across several bit lines within the memory device(s) 240. At any subsequent power up of the system, it will be unknown which bit lines of the memory device(s) 240 are defective or usable before the complete set of data 250 is retrieved. Thus, it is also unknown whether portions of the multiple copies of the set of data 250 have been stored in re-routed bit lines, because the original bit lines were defective.

For example, if the memory controller identifies after power up of the system that bit line 2 is defective, and bit line 2 is re-routed to a spare bit line, portions of the set of data 250 may be stored in usable bit lines 1, 3, and 4. At any subsequent power up of the system, the system would not know that bit line 2 is defective until either the memory device is scanned for defective bit lines or the set of data 250, indicating that bit line 2 is defective, is retrieved. Thus, the memory controller would not know that the portions of the set of data 250 are stored in bit lines 1, 3, and 4 and read the contents of bit lines 1, 2, 3, and 4. The content of bit line 2 would be unusable for reconstruction of the set of data 250. The memory controller can compare the contents retrieved from bit lines 1, 2, 3, and 4 with other copies of the set of data 250 stored in different bit lines. Based on the comparison, the memory controller can match the copies of the set of data 250 and filter out the contents of bit line 2.

The comparison of multiple copies of the set of data 250 can help ensure that the entire set of data 250 is reconstructed, regardless whether portions of some copies of the set of data are stored in bit lines that have been re-routed. Based on the comparison, bit line errors corresponding to the individual memory devices of the system can be identified without scanning every bit line of the memory devices for signatures indicating a usable bit line.

Figure 2C:
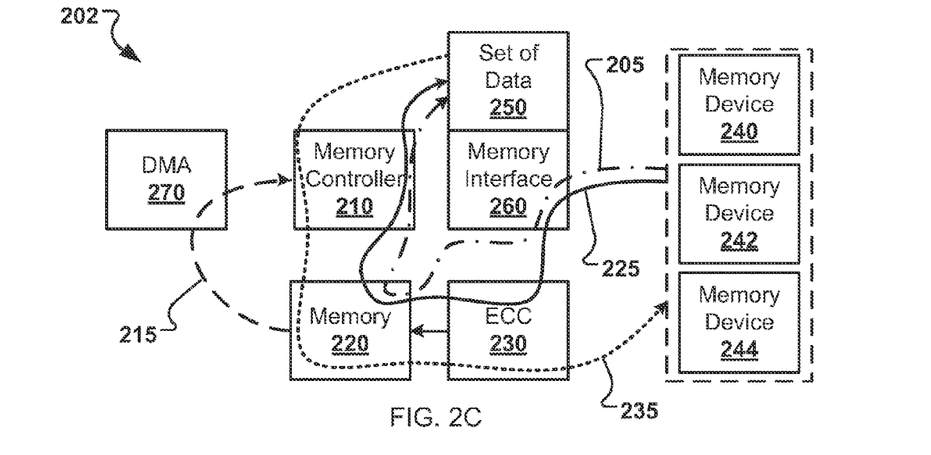
FIG. 2C shows another example of a sequence for scanning a memory device for bit line errors and storing a set of data in the memory device.

FIG. 2C shows another example of a sequence 202 for scanning a memory device for bit line errors and storing a set of data in the memory device. The process of scanning for bit line errors can follow paths 205 or 225 as described above with respect to FIGS. 2A and 2B. In some implementations, the memory controller 210 can initiate the scanning of the memory device 240 to retrieve the bit line error information through the DMA 270 as described with respect to FIG. 2A. The process of storing the set of data 250 to the memory device 240 can follow path 235 as described with respect to FIG. 2B.

In some implementations, the set of data 250 can be stored at a particular memory device 240. At any subsequent power up of the system, the memory controller 210 can scan the bit lines of the memory device 240 and identify the defective bit lines. Taking into consideration the bit line errors identified for the memory device 240 during the scan process, the memory controller 210 can retrieve the set of data 250 stored in the memory device 240 to ascertain defective bit lines for all memory devices of the system. Thus, only the memory device 240 has to be scanned for bit line errors at any subsequent power up to determine the bit line errors for all memory devices of the system. In some implementations, the set of data 250 can be stored in bit lines of the memory device 240 that are, for example, designated for system data. The allocation of particular sections within the memory device 240 for storing the set of data 250 can focus the scan process to identify defective bit lines to these sections within the memory device, and thus, accelerate the reconstruction of the set of data 250.

In some implementations, the bit line error information stored in the set of data 250 can exceed the capacity of an individual memory page of a memory device 240. The size of the set of data 250 can be determined, for example, based on the number of memory devices included in a system and the maximum number of permitted bit line errors within a memory device. The maximum number of permitted bit line errors within a memory device is generally defined in the specifications of the memory device as provided by the memory device manufacturer (e.g., a maximum of 24 defective bit line pairs per 9 KB page)

For example, a system can include 8 channels with 64 memory devices, which is a total of 512 memory devices (8 channels×64 memory devices). The size of a set of data including bit line error information for one device can be, for example, 48 bytes (e.g., based on the maximum number of defective bit lines as defined by the manufacturer). In this case, the overall size of the set of data for all 512 devices would be 24 KB (512 memory devices×48 bytes). For memory devices with a page capacity of 8 KB, three pages would be necessary to store the set of data including the bit line error information for the 512 memory devices (24 KB divided by 8 KB page capacity). The memory pages storing the set of data 250 can be within the same memory device (e.g., memory device 240) or across several memory devices (e.g., memory devices 240, 242, and 244) of the system.

In some implementations, the memory controller 210 can initiate the scanning of every bit for bit line errors of the memory device(s) that are storing the set of data 250 at any subsequent power up. After identifying the bit line error information for the memory device(s) in which the set of data 250 is stored, the memory controller 210 can retrieve the set of data 250 and read the bit line error information for all memory devices of the system. This process avoids the need to scan every bit of all memory devices at subsequent power ups to identify defective bit lines of the memory devices.

In some implementations, a set of data 250 that extends over multiple memory pages can be stored in the same memory device (e.g., memory device 240). Upon subsequent power ups of the system, the memory controller 210 can identify the defective bit lines of the memory device in which the set of data 250 is stored by scanning every bit of the memory device. Upon identification of the bit line errors for the memory device, the memory controller 210 can initiate retrieval of the set of data 250 stored in the memory pages within the device. The memory pages of the memory device in which the set of data 250 is stored can be accessed by the memory controller 210 in sequence. When memory pages are accessed in sequence, the total time required to read all memory pages is determined by the time required to read an individual memory page multiplied by the number of pages to be read.

For example, if the set of data 250 for 512 devices is stored in three memory pages within a single memory device, the three memory pages can be read in sequence after the bit line error information for the device has been determined. If each bit line of a memory device to determine bit line errors for that memory device can be scanned in 70 microseconds and the data contained in an individual memory page within the device can be read in 140 microseconds, the total time required to read the three memory pages including the set of data 250 would be 490 microseconds, 70 microseconds to scan the memory device for bit line errors plus 3×140 microseconds to read the set of data 250 stored in the three memory pages of the memory device in sequence. Thus, the bit line error information for the 512 devices can be determined within 490 microseconds, because the retrieved set of data includes bit line error information for all devices.

In some implementations, a set of data 250 that extends over multiple memory pages can be stored in multiple memory devices (e.g., memory devices 240, 242, and 244). For example at least some of the memory pages including a portion of the set of data 250 can be within a different memory device. Upon subsequent power ups of the system, the memory controller 210 can identify the defective bit lines of the memory devices in which the set of data 250 is stored by scanning every bit of these memory devices. The identification of the defective bit lines of the memory devices storing the set of data 250 can be performed in parallel.

Upon identification of the defective bit lines of the memory devices storing the set of data 250, the memory controller 210 can initiate retrieval of the portion of the set of data 250 stored at the memory page within the respective memory devices. The memory pages within the different memory devices can be accessed by the memory controller 210 in parallel. When memory pages are read in parallel, the total time required to read all pages is determined by the time required to read an individual memory page since each memory page is read at the same time.

A set of data 250 including bit line error information for memory devices (e.g., 512 memory devices) of a system can be stored in three memory pages according to the example described above. Each memory page that includes a portion of the set of data 250 can be within a different memory device of the system. During subsequent power ups of the system, the memory controller 210 can identify the defective bit lines of each memory device in which a portion of the set of data 250 is stored by scanning every bit line of the respective memory device. The bit line error information of each memory device that includes a portion of the set of data 250 can be read in parallel. Therefore, the time it takes to scan the three memory devices in the above example can be 70 microseconds if the three devices are scanned in parallel.

Additionally, after identification of the bit line errors for the three memory devices, the three memory pages including the set of data 250 can be read in parallel. The total time required to read the three memory pages that include the set of data 250 would be 210 microseconds, 70 microseconds to scan the three memory devices for bit line errors in parallel plus 140 microseconds to read the set of data 250 stored in the three memory pages in parallel. Thus, the bit line error information for the 512 devices can be determined within 210 microseconds, because the retrieved set of data includes bit line error information for all devices.

In some implementations, multiple copies of the set of data 250 can be stored across several memory devices to avoid the scanning process for defective bit line of the memory devices of the system. Each memory page in which a portion of the set of data 250 is stored can be within a separate memory device. For example, if the set of data 250 extends over three memory pages, as described in the example above, each copy of the set of data 250 would be stored in three separate memory devices. Thus, to store, for example, ten copies of the set of data 250, thirty memory devices would be required (3 memory pages per copy of the set of data ×10 copies). Upon any subsequent startup, the memory controller 210 can read one memory page form each of the thirty devices that store the ten copies of the set of data 250 in parallel and compare the results to reconstruct the set of data 250, without scanning the bit lines of the memory devices for defects.

Figure 3:
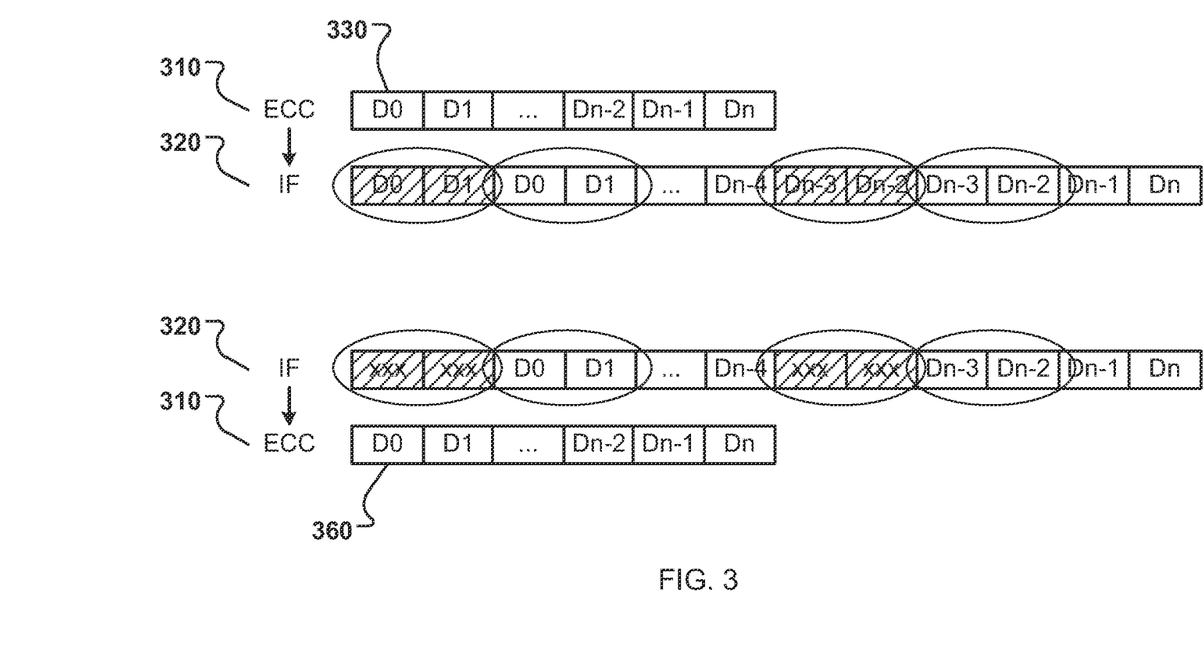
FIG. 3 shows an example for rerouting and skipping defective bit lines of a memory device.

FIG. 3 shows an example for re-routing and skipping defective bit lines of a memory device. The memory device can include several bit lines 330 configured to store information. It can be determined, for example during fabrication of the memory device, that bit lines are defective. The manufacturer may place signatures or information into the individual bits of the bit lines indicating whether the respective bit line is usable. Thus, defective bit lines of a memory device can be identified based on the signatures or information and a system can avoid accessing defective bit lines to store or read data.

In some implementations, an Error Correction Code (ECC) 310 can be implemented for each identified defective bit line at the programming stage. The ECC 310 can be written into memory through the memory interface 320. The example in FIG. 3 shows that the bit lines designated as D0 and D1, as well as the bit lines Dn-3 and Dn-2 are defective and a system should avoid storing information in these defective bit lines. During the program path, the defective bit line pairs D0/D1 and Dn-3/Dn-2 are re-routed to replacement bit lines with the same designation, D0/D1, and Dn-3/Dn-2 respectively. The defective bit lines are designated as disabled during the programming stage. During the reading stage, the disabled bit line pair can be skipped and the replacement bit lines 360 can be accessed instead.

Figure 4:
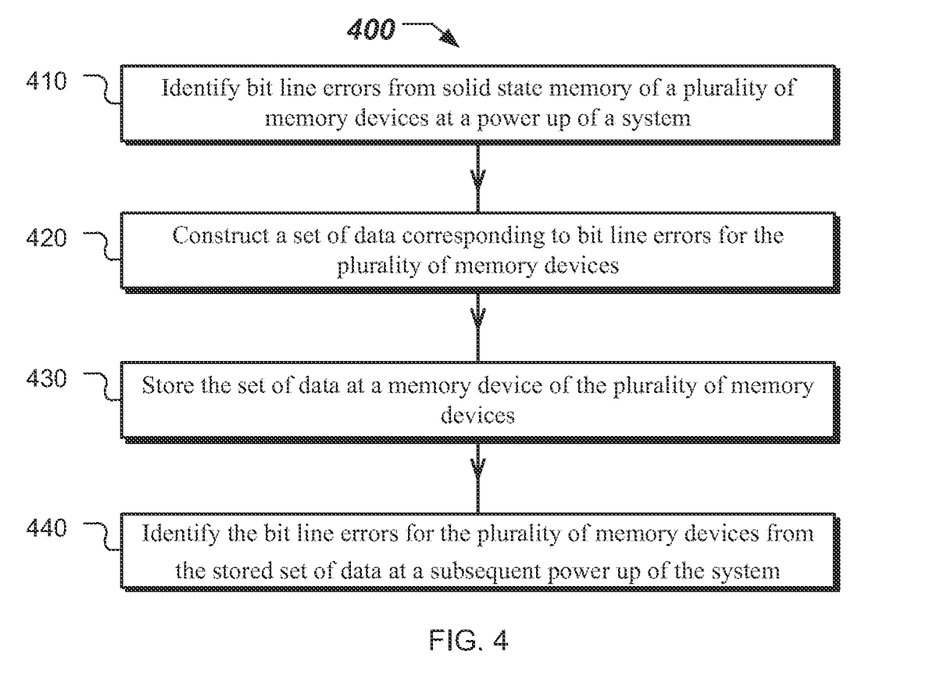
FIG. 4 shows an example of a process for managing bit line error information.

FIG. 4 shows an example process 400 for managing bit line errors of memory devices. At 410, bit line errors in non-volatile memory devices can be identified at power up of a system. In some implementations, the bit line errors can be identified based on signatures stored within the individual bits of the memory device. The signatures can be created, for example, by the memory device manufacturer as part of the fabrication process of the memory device. During power up of the system, every memory device within the system can be scanned for bit line errors. At 420, a set of data corresponding to the bit line errors can be constructed and stored in volatile memory of the system. Based on the set of data, the defective bit lines can be skipped and replaced by spare bit lines of the memory device.

The contents of the volatile memory of the system, including the set of data corresponding to the bit line errors, are generally erased once the system powers down. Thus, the system would scan every bit of the memory device bit lines at a subsequent power up again to identify the defective bit lines. At 430, to make the set of data including the bit line errors available for subsequent power ups, the set of data can be stored at a non-volatile memory device. Because the set of data is stored directly in the persistent memory of the memory device, the bit line errors for each device can be identified by retrieving the stored set of data at any subsequent power up of the system 440 without scanning each bit of each memory device within the system.

Figure 5:
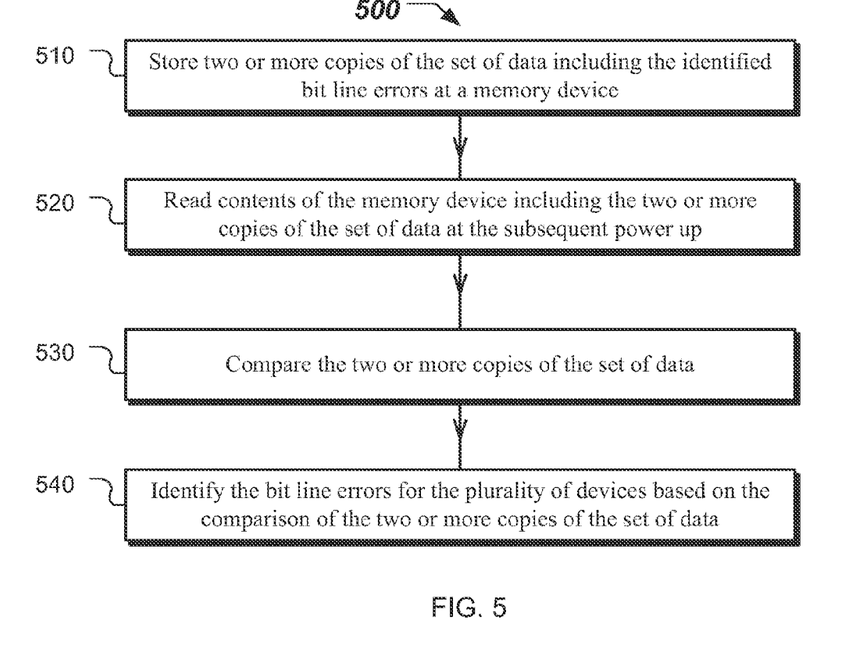
FIG. 5 shows an example of a process for managing bit line error information based on multiple copies of a set of data including bit line errors.

FIG. 5 shows an example process 500 for managing bit line errors based on multiple copies of a set of data including bit line errors, stored on a memory device. Bit line errors of all memory devices within a system can be identified at power up of the system and stored in a set of data as described above. At 510, two or more copies of the set of data including the identified bit line errors can be stored at a memory device within the system. Since the defective bit lines of the memory device are identified before the copies of the set of data are stored in the memory device, the defective bit lines can be avoided when storing the copies. In some implementations, the two or more copies of the set of data can be stored at a section of the memory device that is, for example, designated for system data. At 520, upon any subsequent power up, the memory controller can read the contents stored in the memory device including the copies of the set of data including the bit line error information and retrieve the copies of the set of data.

Each copy of the set of data includes the bit line error information for all memory devices within the system. At 530, the retrieved copies of the set of data can be compared and at 540, bit line errors for all memory devices within the system can be identified based on the comparison of the copies of the set of data including the bit line error information. For example, the retrieved copies can be compared by an 'exclusive or' operation (XOR) resulting in a value of 'true' when the retrieved copies, or a portion thereof, match. Thus, the bit line error information for all memory devices can be retrieved from the copies of the set of data at subsequent power ups without scanning each memory device for bit line errors.

Figure 6:
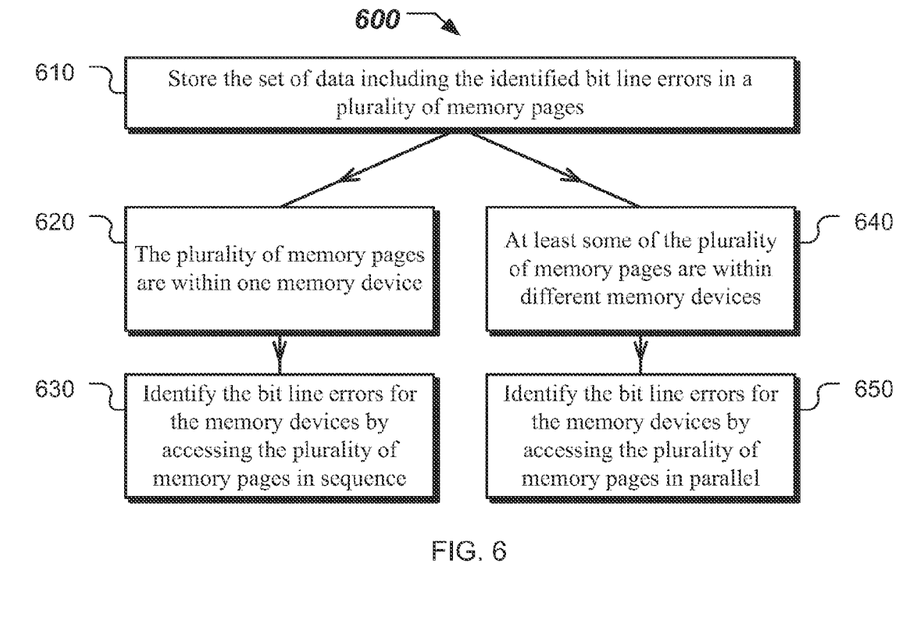
FIG. 6 shows an example of a process for managing bit line error information stored in multiple memory pages within memory devices.

FIG. 6 shows an example of a process 600 for managing bit line error information stored in multiple memory pages within memory devices. Bit line errors of all memory devices within a system can be identified at power up of the system and stored in a set of data as described above. The size of the set of data including the bit line error information can exceed the capacity of a single memory page within a memory device. At 610, the set of data can be stored across multiple memory pages within one or more memory devices. The memory pages can be read in sequence or in parallel. Additionally, if the memory pages, in which the set of data is stored, are in multiple memory devices, the memory devices can be read or scanned in sequence or in parallel. Reading memory pages or scanning memory devices in parallel can reduce the time required to determine bit line errors and/or to obtain the contents of the memory pages.

In some implementations, at 620, the set of data can be stored in multiple memory pages within one memory device. Memory pages within a device are generally read in sequence. However, multiple memory pages within a device can also be read at the same time if the system is configured to support parallel access to multiple memory pages within a device. In some implementations, at 630, the bit line errors for the memory devices can be identified by accessing the plurality of memory pages in sequence. The set of data including the bit line error information for all memory devices can be reconstructed at any subsequent power up by retrieving the contents of each memory page including a portion of the set of data.

In some implementations, at 640, the set of data can be stored in multiple memory pages located within different devices. Memory pages within different devices can be accessed in parallel. Parallel access of memory pages can significantly reduce the time required to retrieve information stored in several memory pages. In some implementations, at 650, the bit line errors for the memory devices can be identified by accessing the plurality of memory pages in parallel. The set of data including the bit line error information for all memory devices can be reconstructed at any subsequent power up by retrieving the contents of each memory page including a portion of the set of data at the same time.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

The implementations described above can also be implemented for other types of non-volatile or persistent memory, which may not be solid state.

What is claimed is:

1. A system comprising:
   a plurality of memory devices including non-volatile solid state memory; and
   a memory controller configured to:
      scan the non-volatile solid state memory of all of the plurality of memory devices to identify one or more bit line errors for the plurality of memory devices;
      construct a set of data corresponding to the identified one or more bit line errors for the plurality of memory devices;
      store multiple copies of the set of data in the non-volatile solid state memory of the plurality of memory devices prior to a power down of the plurality of memory devices; and
      upon power up of the plurality of memory devices that occurs subsequent to the power down prior to which the set of data is stored,
         retrieve the stored multiple copies of the set of data,
         perform a comparison of content of the retrieved copies of the set of data, and
         use results of the comparison to reconstruct the set of data corresponding to the identified one or more bit line errors for the plurality of memory devices.

2. The system of claim 1, wherein ten copies of the set of data are stored in the non-volatile solid state memory of the plurality of memory devices.

3. The system of claim 1, wherein the comparison is an exclusive or operation (XOR) resulting in a value of true when the retrieved copies, or a portion thereof, match.

4. The system of claim 1, wherein the copies of the set of data are stored in a plurality of memory pages.

5. The system of claim 4, wherein
   the plurality of memory pages are within non-volatile solid state memory of a single memory device of the plurality of memory devices, and
   the copies of the stored set of data are retrieved by accessing the plurality of memory pages in series.

6. The system of claim 4, wherein
   at least two of the plurality of memory pages are within non-volatile solid state memory of two different devices of the plurality of memory devices, and
   the copies of the stored set of data are retrieved by accessing the at least two of the plurality of memory pages in parallel.

7. The system of claim 1, wherein the memory controller is further configured to encode the constructed set of data using an error correction code (ECC) prior to storing copies of the set of data in the non-volatile solid state memory of the plurality of memory devices; and decode, using the ECC, the content of the retrieved copies of the set of data prior to performing the comparison thereof.

8. The system of claim 1, wherein the plurality of memory devices are NAND devices.

9. The system of claim 1, wherein the non-volatile solid state memory of all of the plurality of memory devices is scanned, upon a power up of the plurality of memory devices, as part of a validation process carried out during fabrication of the system.

10. A memory controller comprising:
an interface to connect with non-volatile solid state memory of a plurality of memory devices; and
circuitry to:
perform a first scan of the non-volatile solid state memory of all of the plurality of memory devices to identify one or more bit line errors for the plurality of memory devices;
construct a set of data corresponding to the identified one or more bit line errors for the plurality of memory devices;
store the set of data in the non-volatile solid state memory of one or more but fewer than all of the plurality of memory devices prior to a power down of the plurality of memory devices; and
upon power up of the plurality of memory devices that occurs subsequent to the power down prior to which the set of data is stored,
perform a second scan of only the non-volatile solid state memory of the one or more but fewer than all of the plurality of memory devices which store the set of data;
taking into consideration whether any bit line errors are identified during the second scan, retrieve the set of data stored in the non-volatile solid state memory of the one or more but fewer than all of the plurality of memory devices; and
ascertain, from the retrieved set of data, any one or more bit line errors for all remaining ones of the plurality of memory devices which were not scanned as part of performing the second scan.

11. The memory controller of claim 10, wherein the plurality of memory devices are NAND devices.

12. The memory controller of claim 10, wherein the set of data is stored in a plurality of memory pages.

13. The memory controller of claim 12, wherein
the plurality of memory pages are within non-volatile solid state memory of a single memory device of the plurality of memory devices,
the second scan is performed by scanning only the non-volatile solid state memory of the single memory device, and
the stored set of data is retrieved by accessing the plurality of memory pages in series.

14. The memory controller of claim 12, wherein
the plurality of memory devices comprises three or more memory devices,
at least two of the plurality of memory pages are within non-volatile solid state memory of two different memory devices of the plurality of memory devices,
the second scan is performed by scanning only the non-volatile solid state memory of the two different memory devices, and
the stored set of data is retrieved by accessing the at least two of the plurality of memory pages in parallel.

15. The memory controller of claim 10, wherein the circuitry is further configured to
encode the constructed set of data using an error correction code (ECC) prior to storing the set of data in the non-volatile solid state memory of the plurality of memory devices; and
decode, using the ECC, the content of the retrieved set of data prior to ascertaining any one or more bit line errors for all remaining ones of the plurality of memory devices which were not scanned as part of performing the second scan.

16. The memory controller of claim 10, wherein the first scan of the non-volatile solid state memory of all of the plurality of memory devices is performed, upon a power up of the plurality of memory devices, as part of a validation process carried out during fabrication of a system including the plurality of memory devices and the memory controller.

17. A method performed by a memory controller that is communicatively coupled with a plurality of memory devices including non-volatile solid state memory, the method comprising:
performing a first scan of the non-volatile solid state memory of all of the plurality of memory devices to identify one or more bit line errors for the plurality of memory devices;
constructing a set of data corresponding to the identified one or more bit line errors for the plurality of memory devices;
storing the set of data in the non-volatile solid state memory of one or more but fewer than all of the plurality of memory devices prior to a power down of the plurality of memory devices; and
upon power up of the plurality of memory devices that occurs subsequent to the power down prior to which the set of data is stored,
performing a second scan of only the non-volatile solid state memory of the one or more but fewer than all of the plurality of memory devices which store the set of data;
taking into consideration whether any bit line errors are identified during the second scan, retrieving the set of data stored in the non-volatile solid state memory of the one or more but fewer than all of the plurality of memory devices; and
ascertaining, from the retrieved set of data, any one or more bit line errors for all remaining ones of the plurality of memory devices which were not scanned as part of performing the second scan.

18. The method of claim 17, wherein the first scan of the non-volatile solid state memory of all of the plurality of memory devices is performed, upon a power up, as part of a validation process carried out during fabrication of a system including the plurality of memory devices and the memory controller.

19. The method of claim 17, wherein storing the set of data comprises storing the set of data in a plurality of memory pages.

20. The method of claim 19, wherein
the plurality of memory pages are within non-volatile solid state memory of a single memory device of the plurality of memory devices,
the second scan is performed by scanning only the non-volatile solid state memory of the single memory device, and
the method further comprises retrieving the set of data by accessing the plurality of memory pages in series.

21. The method of claim 19, wherein
the plurality of memory devices comprises three or more memory devices,
at least two of the plurality of memory pages are within non-volatile solid state memory of two different memory devices of the plurality of memory devices, and
the method further comprises retrieving the set of data by accessing the at least two of the plurality of memory pages in parallel.

22. The method of claim 17, further comprising:
encoding the constructed set of data using an error correction code (ECC) prior to storing the set of data in the non-volatile solid state memory of the plurality of memory devices; and
decoding, by using the ECC, the content of the retrieved set of data prior to performing the ascertaining.

23. A method performed by a memory controller that is communicatively coupled with a plurality of memory devices including non-volatile solid state memory, the method comprising:
scanning the non-volatile solid state memory of all of the plurality of memory devices to identify one or more bit line errors for the plurality of memory devices;
constructing a set of data corresponding to the identified one or more bit line errors for the plurality of memory devices;
storing multiple copies of the set of data in the non-volatile solid state memory of the plurality of memory devices prior to a power down of the plurality of memory devices; and
upon power up of the plurality of memory devices that occurs subsequent to the power down prior to which the set of data is stored,
retrieving the stored multiple copies of the set of data,
performing a comparison of content of the retrieved copies of the set of data, and
reconstructing, based on results of the comparison, the set of data corresponding to the identified one or more bit line errors for the plurality of memory devices.

24. The method of claim 23, wherein the scanning of the non-volatile solid state memory of all of the plurality of memory devices is performed, upon a power up of the plurality of memory devices, as part of a validation process carried out during fabrication of a system including the plurality of memory devices and the memory controller.

25. The method of claim 23, wherein ten copies of the set of data are stored in the non-volatile solid state memory of the plurality of memory devices.

26. The method of claim 23, wherein the comparison is an exclusive or operation (XOR) resulting in a value of true when the retrieved copies, or a portion thereof, match.

27. The method of claim 23, wherein the copies of the set of data are stored in a plurality of memory pages.

28. The method of claim 27, wherein
the plurality of memory pages are within non-volatile solid state memory of a single memory device of the plurality of memory devices, and
the copies of the stored set of data are retrieved by accessing the plurality of memory pages in series.

29. The method of claim 27, wherein
at least two of the plurality of memory pages are within non-volatile solid state memory of two different devices of the plurality of memory devices, and
the copies of the stored set of data are retrieved by accessing the at least two of the plurality of memory pages in parallel.

30. The method of claim 23 further comprising:
encoding the constructed set of data using an error correction code (ECC) prior to storing copies of the set of data in the non-volatile solid state memory of the plurality of memory devices; and
decoding, using the ECC, the content of the retrieved copies of the set of data prior to performing the comparison thereof.

* * * * *